(12) United States Patent
Li et al.

(10) Patent No.: US 12,433,120 B2
(45) Date of Patent: Sep. 30, 2025

(54) ARRAY SUBSTRATE AND DISPLAY DEVICE

(71) Applicant: BOE Technology Group Co., Ltd., Beijing (CN)

(72) Inventors: Mei Li, Beijing (CN); Libin Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 121 days.

(21) Appl. No.: 17/773,595

(22) PCT Filed: Apr. 1, 2021

(86) PCT No.: PCT/CN2021/085079
§ 371 (c)(1),
(2) Date: Apr. 29, 2022

(87) PCT Pub. No.: WO2022/205364
PCT Pub. Date: Oct. 6, 2022

(65) Prior Publication Data
US 2024/0179985 A1 May 30, 2024

(51) Int. Cl.
*G09G 3/20* (2006.01)
*G09G 3/3233* (2016.01)
*H10K 59/131* (2023.01)

(52) U.S. Cl.
CPC ....... *H10K 59/1315* (2023.02); *H10K 59/131* (2023.02)

(58) Field of Classification Search
CPC ............. H10K 59/131; H10K 59/1213; H10K 59/1216; H10K 59/353; H01L 21/76805
See application file for complete search history.

(56) References Cited

U.S. PATENT DOCUMENTS 9,379,137 B2  6/2016  Kim et al.
10,229,938 B2  3/2019  Zhang et al.
(Continued)

FOREIGN PATENT DOCUMENTS

CN   103474435 A   12/2013
CN   109491543 A   3/2019
(Continued)

OTHER PUBLICATIONS

International Search Report of Application No. PCT/CN2021/085079 dated on Jan. 5, 2022, with English translation, (4p).
(Continued)

*Primary Examiner* — Kyoung Lee
*Assistant Examiner* — David J Goodwin
(74) *Attorney, Agent, or Firm* — Arch & Lake LLP

(57) ABSTRACT

The present disclosure is related to an array substrate and a display device. The array substrate has a display area and a peripheral area surrounding the display area. The array substrate includes a gate material layer and a source and drain material layer that are sequentially stacked on a base substrate. The array substrate further includes a driving signal line. The driving signal line includes a first sub-signal line and a second sub-signal line. The first sub-signal line is arranged in the gate material layer and extends from the peripheral area to the display area. The second sub-signal line is arranged in the source and drain material layer and located at least in the display area. The first sub-signal line and the second sub-signal line are electrically connected through a via hole.

20 Claims, 11 Drawing Sheets

(56) References Cited

U.S. PATENT DOCUMENTS

| | | | |
|---|---|---|---|
| 11,079,871 B2 | 8/2021 | Sun et al. | |
| 11,380,715 B2 * | 7/2022 | Tian | H10D 86/60 |
| 11,721,286 B2 * | 8/2023 | Zhang | G09G 3/3233 |
| | | | 345/204 |
| 11,762,489 B2 * | 9/2023 | Guo | G06F 3/0412 |
| | | | 345/174 |
| 12,219,836 B2 * | 2/2025 | Liao | G09G 3/3258 |
| 2015/0123136 A1 | 5/2015 | Kim et al. | |
| 2016/0035747 A1 | 2/2016 | Zhang et al. | |
| 2018/0356664 A1 * | 12/2018 | Yang | G02F 1/13338 |
| 2020/0083306 A1 | 3/2020 | Choi et al. | |
| 2020/0176550 A1 | 6/2020 | Youn et al. | |
| 2020/0356205 A1 | 11/2020 | Sun et al. | |
| 2021/0036089 A1 | 2/2021 | Li et al. | |
| 2021/0257440 A1 | 8/2021 | Long et al. | |
| 2022/0180784 A1 * | 6/2022 | Liu | H10D 89/931 |
| 2022/0320196 A1 * | 10/2022 | He | H10K 59/1216 |
| 2023/0154383 A1 * | 5/2023 | Zou | G09G 3/20 |

FOREIGN PATENT DOCUMENTS

| | | |
|---|---|---|
| CN | 109686758 A | 4/2019 |
| CN | 110416270 A | 11/2019 |
| CN | 110429116 A | 11/2019 |
| CN | 209729911 U | 12/2019 |
| CN | 110707107 A | 1/2020 |
| CN | 110828489 A | 2/2020 |
| CN | 111312730 A | 6/2020 |
| CN | 111682054 A | 9/2020 |
| EP | 2871517 A1 | 5/2015 |
| EP | 2871517 B1 | 10/2016 |

OTHER PUBLICATIONS

Written Opinion the ISA of Application No. PCT/CN2021/085079 dated on Dec. 20, 2021, with English translation, (4p).

* cited by examiner

200

71

51

91

61

310

420

ARRAY SUBSTRATE AND DISPLAY DEVICE

This application is the 371 application of PCT Application No. PCT/CN2021/085079, filed on Apr. 1, 2021, the entire contents of which are incorporated herein by reference in its entirety.

TECHNICAL FIELD

Embodiments of the present disclosure generally relate to the display technical field, and more particularly, to an array substrate and a display device.

BACKGROUND

The Organic Light Emitting Diode (OLED) display technology is recognized as the third generation display technology by the industry due to its advantages such as lightness and thinness, self-luminescence, wide viewing angle, fast response speed, low brightness and low power consumption. The OLED technology has been widely used in the field of high performance display.

In AMOLED display products, due to long signal lines, the load of output lines of a GOA circuit is too large. On the one hand, the large load results in large overall power consumption of the display panel. On the other hand, the large load requires a stronger load-carrying capacity of the GOA circuit, and accordingly the size of the output lines will become longer, which is not conducive to realization of narrow frame. Thus, higher requirements for the design of signal lines are set.

SUMMARY

An objective of the present disclosure is to provide an array substrate and a display device to overcome shortcomings in related art.

According to a first aspect of the present disclosure, there is provided an array substrate having a display area and a peripheral area surrounding the display area. The array substrate further includes:
  a base substrate;
  a gate material layer arranged on a side of the base substrate; and
  a source and drain material layer arranged on a side of the gate material layer away from the base substrate;
  wherein the array substrate further includes a driving signal line, the driving signal line includes a first sub-signal line and a second sub-signal line, the first sub-signal line is arranged in the gate material layer and extends from the peripheral area to the display area, the second sub-signal line is arranged in the source and drain material layer and located at least in the display area, and the first sub-signal line and the second sub-signal line are electrically connected through a via hole.

In an example embodiment of the present disclosure, the source and drain material layer includes:
  a first source and drain material sub-layer arranged on the side of the gate material layer away from the base substrate; and
  a second source and drain material sub-layer arranged on a side of the second source and drain material sub-layer away from the first source and drain material sub-layer;
  wherein the second sub-signal line is arranged in the first source and drain material sub-layer or the second source and drain material sub-layer.

In an example embodiment of the present disclosure, the driving signal line includes a gate driving signal line;
  the first sub-signal line includes a first sub-gate driving line;
  the second sub-signal line include a second sub-gate driving line;
  the first sub-gate driving line is arranged in the gate material layer and extends from the peripheral area to the display area;
  the second sub-gate driving line is arranged in the first source and drain material sub-layer or in the second source and drain material sub-layer and the second sub-gate driving line is located at least in the display area; and
  the first sub-gate driving line and the second sub-gate driving line are electrically connected through a via hole.

In an example embodiment of the present disclosure, the driving signal line comprises an enable signal line;
  the first sub-signal line comprises a first sub-enable signal line;
  the second sub-signal line comprises a second sub-enable signal line;
  the first sub-enable signal line is arranged in the gate material layer and extends from the peripheral area to the display area;
  the second sub-enable signal line is arranged in the first source and drain material sub-layer or in the second source and drain material sub-layer and the second sub-enable signal line is located at least in the display area; and
  the first sub-enable signal line and the second sub-enable signal line are electrically connected through a via hole.

In an example embodiment of the present disclosure, the driving signal line includes a reset signal line;
  the first sub-signal line includes a first sub-reset signal line;
  the second sub-signal line includes a second sub-reset signal line;
  the first sub-reset signal line is arranged in the gate material layer and extends from the peripheral area to the display area;
  the second sub-reset signal line is arranged in the first source and drain material sub-layer or in the second source and drain material sub-layer and the second sub-reset signal line is located at least in the display area; and
  the first sub-reset signal line and the second sub-reset signal line are electrically connected through a via hole.

In an example embodiment of the present disclosure, the first sub-signal line and the second sub-signal line extend in a same direction, or extend in different directions.

In an example embodiment of the present disclosure, the array substrate further includes a power line, the power line includes a first sub-power line and a second sub-power line, the first sub-power line is arranged in the first source and drain material sub-layer, the second sub-power line is arranged in the second source and drain material sub-layer, and the first sub-power line and the second sub-power line are electrically connected through a via hole.

In an example embodiment of the present disclosure, the second sub-signal line and the second sub-power line are both located in the second source and drain material sub-layer, and the second sub-signal line and the second sub-power line extend in a same direction and are arranged in another direction.

In an example embodiment of the present disclosure, the first sub-signal line extends along a first direction, the first sub-power line extends along a second direction, the second sub-signal line and the second sub-power line both extend along the first direction and are arranged along the second direction, and the first direction and the second direction intersect.

In an example embodiment of the present disclosure, a projection of the first sub-signal line on the base substrate and a projection of the second sub-signal line on the base substrate overlap.

In an example embodiment of the present disclosure, the second sub-signal line is further located in the peripheral area, and the first sub-signal line and the second sub-signal line are electrically connected through the via hoe in the peripheral area.

In an example embodiment of the present disclosure, a line width of the second sub-signal line is greater than a line width of the first sub-signal line.

In an example embodiment of the present disclosure, the line width of the second sub-signal line is greater than or equal to 5 μm.

In an example embodiment of the present disclosure, the array substrate includes a GOA driving circuit, and the first sub-signal line is connected to an output terminal of the GOA driving circuit.

In an example embodiment of the present disclosure, the gate material layer includes a first gate material layer and a second gate material layer that are stacked and a gate insulating layer between the first gate material layer and the second gate material layer, and the first sub-signal line is located in the first gate material layer or the second gate material layer.

According to another aspect of the present disclosure, there is provided a display device, including the array substrate as described above.

It should be understood that both the foregoing general description and the following detailed description are exemplary and explanatory only and should not be construed as constituting any limitations on the present disclosure.

BRIEF DESCRIPTION OF THE DRAWINGS

The accompanying drawings, which are incorporated in and constitute a part of the description, illustrate embodiments consistent with the disclosure and serve to explain principles of the disclosure together with the description. Obviously, the drawings in the following description are only some embodiments of the present disclosure, and for those of ordinary skill in the art, other drawings can be obtained from these drawings without creative effort.

LISTING OF REFERENCE NUMBERS

Figure 1:
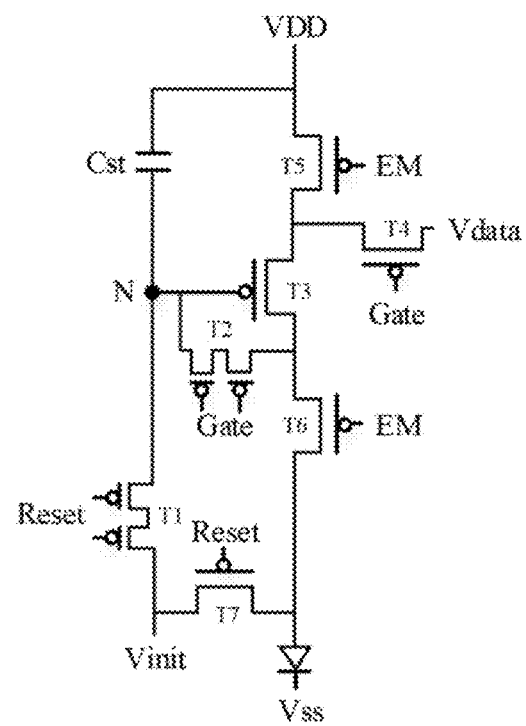
FIG. 1 is a schematic diagram of a 7T1C pixel circuit structure.

100: base substrate; 200: active layer; 201: gate insulating layer; 300: gate material layer; 310: first gate material layer; 320: second gate material layer; 301: interlayer dielectric layer; 400: source and drain material layer; 410: first source and drain material sub-layer; 401: insulating layer; 402: planarization layer; 420: second source and drain material sub-layer; 51: first sub-gate driving line; 52: the second sub-gate driving line; 61: first sub-enable signal line; 62: second sub-enable signal line; 71: first sub-reset signal line; 72: second sub-reset signal line; 80: connection portion; 81: first sub-power line; 82: the second sub-power line.

DETAILED DESCRIPTION

Example embodiments will now be described more fully with reference to the accompanying drawings. However, the embodiments can be implemented in a variety of forms and should not be construed as being limited to the examples set forth herein; rather, these embodiments are provided so that the present disclosure will be more complete so as to convey the idea of the example embodiments to those skilled in this art. The same reference signs in the drawings indicate the same or similar structures, and thus their repeated descriptions will be omitted. In addition, the drawings are only schematic illustrations of embodiments of the present disclosure, and are not necessarily drawn to scale.

Although relative terms such as "upper" and "lower" are used in this specification to describe relative relationships between one component in a figure and another component, these terms are used only for convenience, for example, these terms are based on the directions shown in the drawings. It can be understood that if a device shown in a figure is turned upside down, a component described as "upper" will become a "lower" component. When a structure is "on" another structure, it may mean that the structure is integrally formed on another structure, or that the structure is "directly" arranged on another structure, or that the structure is "indirectly" arranged on another structure through a further structure.

The terms "a", "an", "the", "said" and "at least one" are used to indicate the presence of one or more elements/components/etc.; the terms "include" and "have" are open terms and means inclusive, and refers to that in addition to the listed elements/components and so on, there may be other elements/components and so on. The terms "first", "second" and "third" etc. are used only as markers and are not intended to limit the number of associated objects.

Embodiments of the present disclosure provide an array substrate having a display area and a peripheral area surrounding the display area. The array substrate further includes a base substrate 100 and a gate material layer 300 and a source and drain material layer 400 that are sequentially stacked on the base substrate 100. The array substrate further includes a driving signal line. The driving signal line includes a first sub-signal line and a second sub-signal line. The first sub-signal line is arranged in the gate material layer 300 and extends from the peripheral area to the display area. The second sub-signal line is arranged in the source and drain material layer 400 and is located at least in the display area. The first sub-signal line and the second sub-signal line are electrically connected through a via hole.

In embodiments of the present disclosure, the wiring of driving signal line is divided into two layers, one is located in the gate material layer 300 and the other is located in the source and drain material layer 400, and the two layers are connected in parallel to reduce the load resistance on the driving signal line, thereby reducing the output power consumption of the driving circuit and meanwhile reducing the size of the driving circuit. On the other hand, the resistivity of the gate material layer 300 is relatively high (about 0.52 $\Omega$/m), and the resistivity of the source and drain material layer 400 is relatively low (about 0.045 $\Omega$/m). By connecting a signal line with a high resistivity with a signal line with a low resistivity in parallel, the overall load resistance of the signal lines is decreased.

The gate material layer refers to a material layer of the gate metal of the driving circuit, and the gate material layer may include gate patterns, scan line patterns, and so on. Similarly, the source and drain material layer refers to a film layer of the source and drain electrode material of transistors in the driving circuit, and the source and drain material layer may include source and drain patterns or power signal line patterns, or other transfer patterns, and so on.

FIG. 1 is a schematic structural diagram of a 7T1C pixel circuit. The pixel driving circuit may include: a first transistor T1, a second transistor T2, a driving transistor T3, a fourth transistor T4, a fifth transistor T5, a sixth transistor T6, a seventh transistor T7 and a capacitor C. A first electrode of the first transistor T1 is connected to a node N, a second electrode of the first transistor T1 is connected to an initialization signal line Vinit, and a gate of the first transistor T1 is connected to a reset signal line Re. A first electrode of the second transistor T2 is connected to a first electrode of the driving transistor T3, a second electrode the second transistor T2 is connected to the node N, and a gate of the second transistor T2 is connected to a gate driving signal line Gate. A gate of the driving transistor T3 is connected to the node N. A first electrode of the fourth transistor T4 is connected to a data signal line Data, a second electrode of the fourth transistor T4 is connected to a second electrode of the driving transistor T3, and a gate of the fourth transistor T4 is connected to the gate driving signal line Gate. A first electrode of the fifth transistor T5 is connected to a first power signal line VDD, a second electrode of the fifth transistor T5 is connected to the second electrode of the driving transistor T3, and a gate of the fifth transistor T5 is connected to an enable signal line EM. A first electrode of the sixth transistor T6 is connected to the first electrode of the driving transistor T3, and a gate of the sixth transistor T6 is connected to the enable signal line EM. A first electrode of the seventh transistor T7 is connected to the initialization signal line Vinit, and a second electrode of the seventh transistor T7 is connected to a second electrode of the sixth transistor T6. The pixel driving circuit may be connected to a light-emitting unit OLED for driving the light-emitting unit OLED to emit light. The light-emitting unit OLED may be connected between the second electrode of the sixth transistor T6 and a second power line VSS. The transistors T1 to T7 may all be P-type transistors.

Figure 2:
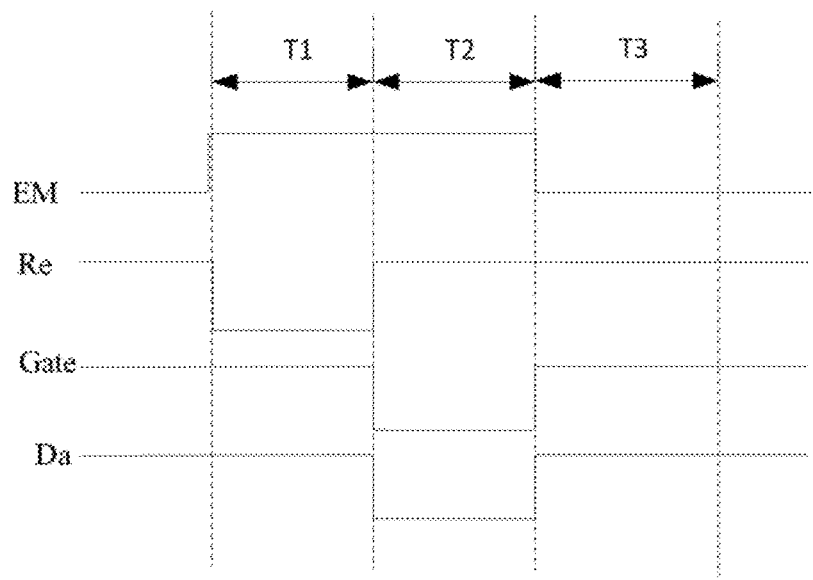
FIG. 2 is a timing diagram for each node in a driving method of the pixel driving circuit of FIG. 1.

FIG. 2 is a timing diagram for each node in a driving method of the pixel driving circuit of FIG. 1. In FIG. 2, Gate represents the timing of the gate driving signal terminal Gate, Re represents the timing of the reset signal terminal Re, EM represents the timing of the enable signal terminal EM, and Data represents the timing of the data signal terminal Data. The driving method of the pixel driving circuit may include a reset stage t1, a compensation stage t2, and a light-emitting stage t3. In the reset stage t1, the reset signal terminal Re outputs a low level signal, the first transistor T1 and the seventh transistor T7 are turned on, and the initialization signal terminal Vinit inputs the initialization signal to the node N and the second electrode of the sixth transistor T6. In the compensation stage t2, the gate driving signal terminal Gate outputs a low level signal, the fourth transistor T4 and the second transistor T2 are turned on, and at the same time the data signal terminal Data outputs a driving signal to write a voltage to the node N. In the light-emitting stage t3, the enable signal terminal EM outputs a low level signal, the sixth transistor T6 and the fifth transistor T5 are turned on, and the driving transistor T3 emits light under the action of the voltage stored by the capacitor C.

Figure 3:
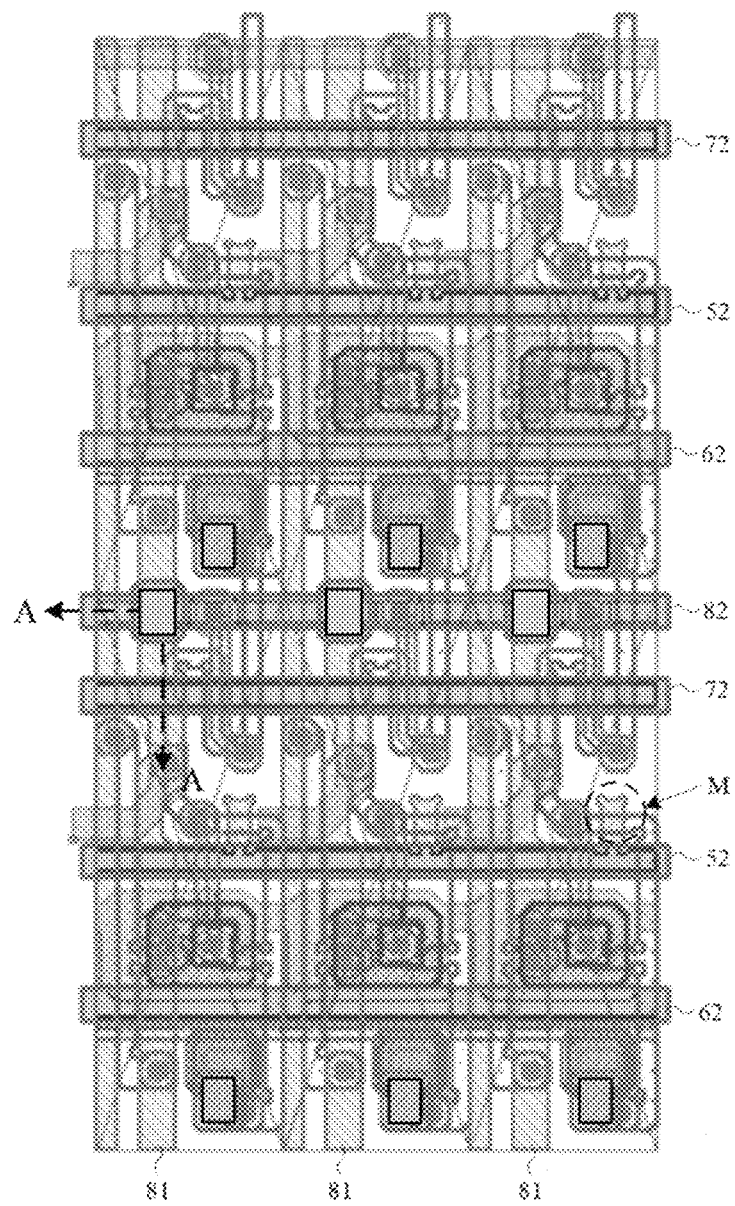
FIG. 3 is a structural layout of an array substrate according to an embodiment.
Figure 4:
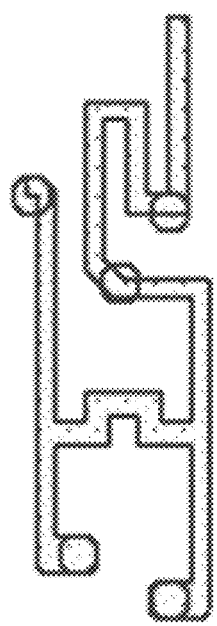
FIG. 4 is a schematic structural diagram of an active layer in FIG. 3.
Figure 5:
FIG. 5 is a schematic structural diagram of a first gate material layer in FIG. 3.
Figure 5:
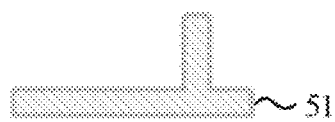
Figure 5:
Figure 5:
Figure 6:
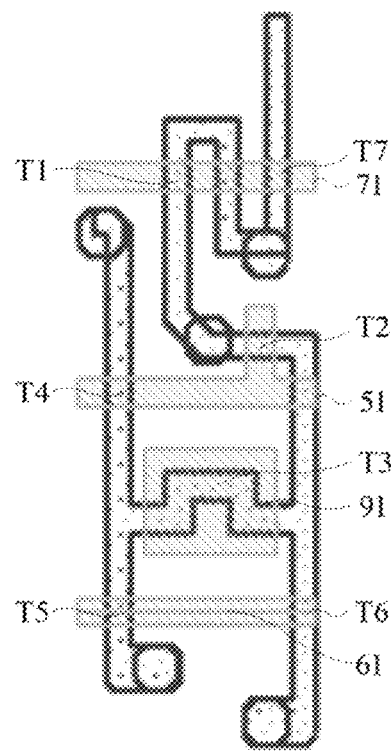
FIG. 6 is a schematic diagram of a stacked structure of FIGS. 4 and 5.
Figure 7:
FIG. 7 is a schematic structural diagram of a second gate material layer in FIG. 3.
Figure 7:
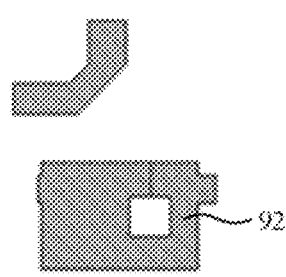
Figure 8:
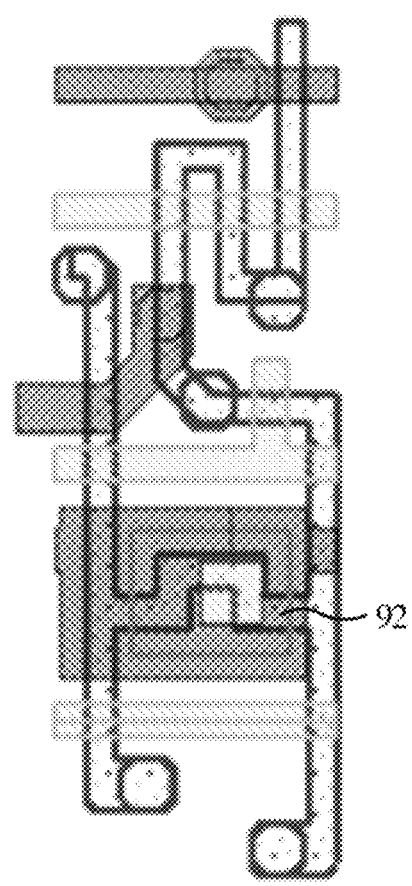
FIG. 8 is a schematic diagram of a stacked structure of FIGS. 6 and 7.
Figure 9:
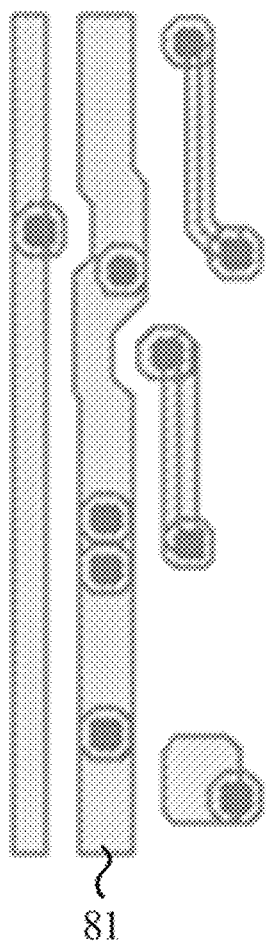
FIG. 9 is a schematic structural diagram of a first source and drain material sub-layer in FIG. 3.
Figure 10:
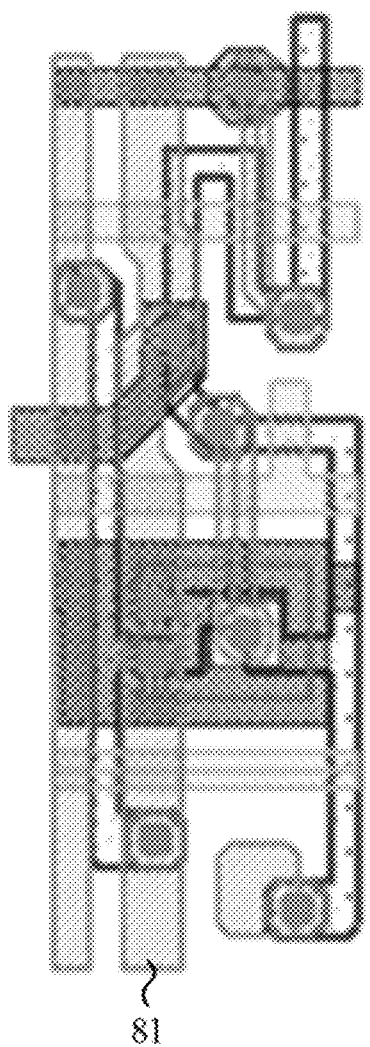
FIG. 10 is a schematic diagram of a stacked structure of FIGS. 8 and 9.
Figure 11:
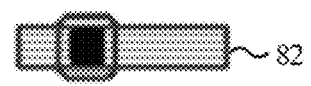
FIG. 11 is a schematic structural diagram of a second source and drain material sub-layer in FIG. 3.
Figure 11:
Figure 11:
Figure 11:
Figure 11:
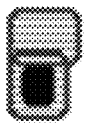

As shown in FIG. 3, FIG. 3 is an example structural layout of an array substrate according to an embodiment. The array substrate shown in FIG. 3 can form the pixel driving circuit shown in FIG. 1. FIGS. 4 to 12 show schematic diagrams of film layers and schematic diagrams of stacked layers in the array substrate in sequence. Referring to the above drawings, the array substrate includes a base substrate 100, an active layer 200 on a side of the base substrate 100, a first gate material layer 310 on a side of the active layer 200 away from the base substrate 100, a second gate material layer 310 on a side of the first gate material layer 310 away from the base substrate 100, a first source and drain material sub-layer 410 on a side of the second gate material layer 310 away from the base substrate 100, and a second source and drain material sub-layer 420 on a side of the first source and drain material sub-layer 410 away from the base substrate 100. A gate insulating layer 201 is arranged between the active layer 200 and the first gate material layer 310, and between the first gate material layer 310 and the second gate material layer 320. A first interlayer dielectric layer 301 is arranged between the second gate material layer 320 and the first source and drain material sub-layer 410, and an insulating layer 401 is arranged between the first source and drain material sub-layer 410 and the second source and drain material sub-layer 420.

The base substrate 100 may be formed of an insulating material. For example, the base substrate 100 may include a first polyimide (PI) layer, a first silicon oxide (SiO) layer, an amorphous silicon layer and a second polyimide (PI) layer, and a second silicon dioxide layer which are sequentially arranged. The original material for forming the active layer may be a semiconductor. During the manufacturing process of the array substrate, a conductorization process may be performed on the active layer by using a first conductive layer as a mask, so as to convert the semiconductor structure outside the transistor channel region into a conductive structure.

Both the first source and drain material sub-layer 410 and the second source and drain material sub-layer 420 may be formed by at least one metal layer. For example, both the first source and drain material sub-layer 410 and the second source and drain material sub-layer 420 may be any one or more metal materials of magnesium, silver, copper, aluminum, molybdenum, etc., or an alloy of any two or more of the above-mentioned materials, or each of the first source and drain material sub-layer 410 and the second source and drain material sub-layer 420 may be formed as a single-layer structure or the first source and drain material sub-layer 410 and the second source and drain material sub-layer 420 may be formed as a stacked structure. For example, each of the first source and drain material sub-layer 410 and the second source and drain material sub-layer 420 may be formed by a first titanium layer, an aluminum layer and a second titanium layer which are sequentially stacked. The gate insulating layer arranged between the first gate material layer 310 and the active layer 200 and between the first gate material layer 310 and the second gate material layer 320 may be a silicon oxide layer. The interlayer dielectric layer between the second gate material layer 320 and the first source and drain material sub-layer 410, and the insulating layer between the first source and drain material sub-layer 410 and the second source and drain material sub-layer 420 may be a silicon nitride layer. Similarly, the gate material layer may also be a single metal material or an alloy material, and may be a single-layer structure or stacked-layer structure, and details will not be repeated here.

In one embodiment, the array substrate further includes a gate driving signal line, and the gate driving signal line can be used to provide the gate driving signal Gate in FIG. 1 to provide the gate driving signal to the driving transistor. Referring to FIG. 5, FIG. 6, FIG. 11 and FIG. 12, the gate driving signal line includes a first sub-gate driving line 51 and a second sub-gate driving line 52. The first sub-gate driving line 51 is arranged in the first gate material layer 310 and extends from the peripheral area to the display area. One end of the first sub-gate driving line 51 located in the peripheral area is connected to a driving chip or a GOA driving circuit to receive the driving signal. The second sub-gate driving line 52 is arranged in the first source and drain material sub-layer 410 or the second source and drain material sub-layer 420 and is located at least in the display area. Since the first sub-gate driving line 51 and the second sub-gate driving line 52 are located in different layers, they are electrically connected through a via hole. Connecting the two layers of gate driving lines in parallel can reduce the load resistance on the gate driving signal lines, thereby reducing the output power consumption of the driving circuit. The first sub-gate driving line 51 and the second sub-gate driving line 52 may extend in the same direction, or may extend in different directions.

Figure 12:
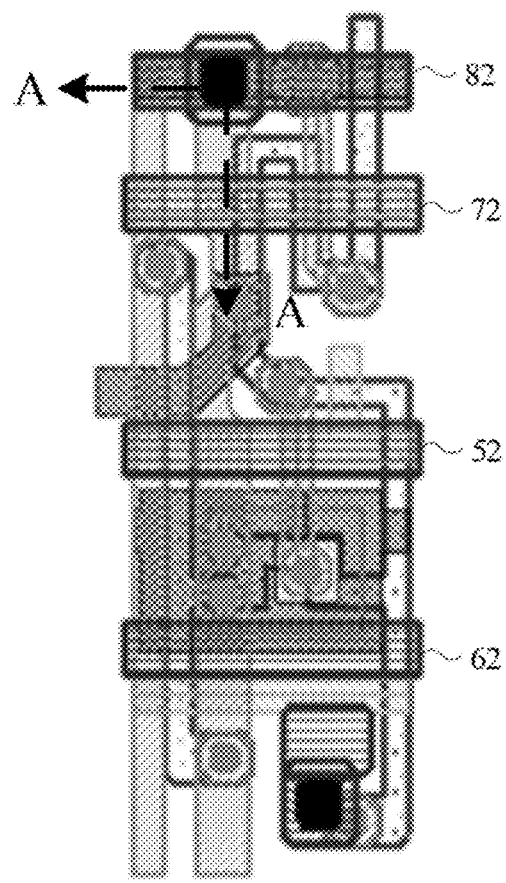
FIG. 12 is a schematic diagram of a stacked structure of FIGS. 10 and 11.
Figure 13:
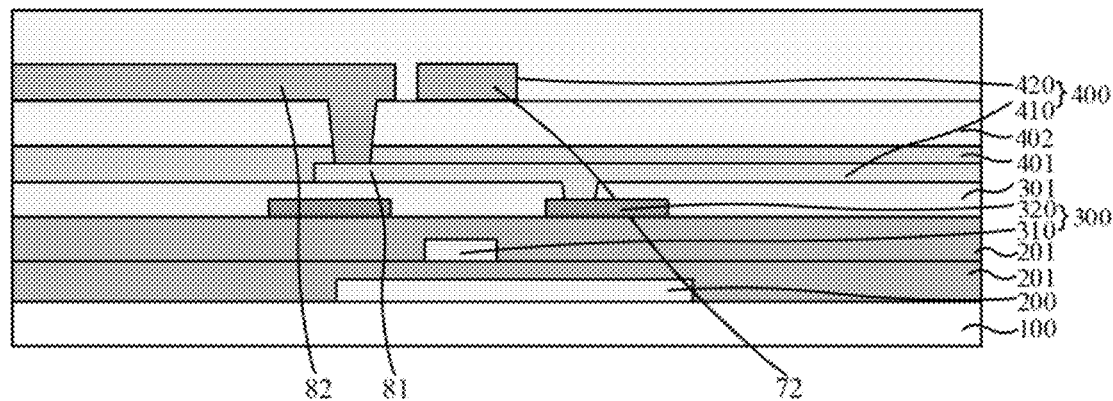
FIG. 13 is a schematic cross-sectional view of FIG. 3 and FIG. 12 along the direction A-A.

In some embodiments, the array substrate further includes a power line, and the power line may be used to provide the power supply signal VDD in FIG. 1 to provide a power signal to the first electrode of the capacitor C. In one embodiment, referring to FIGS. 9-12, the power line includes a first sub-power line 81 and a second sub-power line 82. The first sub-power line 81 is arranged in the first source and drain material sub-layer 410, and the second sub-power line 82 is arranged in the second source and drain material sub-layer 420. Since the first sub-power line 81 and the second sub-power line 82 are located in different layers, they are electrically connected through a via hole. Placing the power lines in two source and drain material layers connecting the two power lines in parallel can reduce the IR drop of the power lines. As shown in FIG. 3 and FIG. 12, in an embodiment, the first sub-power line 81 extends in the vertical direction, and the second sub-power line 82 extends in the horizontal direction, and the first sub-power line 81 and the second sub-power line 82 intersect to form a grid shape, which can increase the transmission path of power signals, and accordingly minimize the IR drop of the power lines. FIG. 13 is an –AA cross-section which shows the electrical connection between the first sub-power line 81 and the second sub-power line 82. The first sub-power line 81 and the second sub-power line 82 may be electrically connected through a via hole which passes through the insulating layer 401. When other film layer, such as the planarization layer 402, is also included between the first source and drain material sub-layer 410 and the second source and drain material sub-layer 420, the via hole also needs to penetrate other film layer. In addition, in some embodiments, the projection of the second sub-power line 82 extending laterally on the base substrate overlaps with the projection of an initialization signal line located in the second gate material layer 320 on the base substrate, which can reduce space occupied by wiring, and further improve the transmittance of the panel. Since both the power signal and the initialization signal are used to transmit constant signals, the overlap of the projections has little effect on the signal stability.

When the second sub-gate driving line 52 and the second sub-power line 82 are both located in the second source and drain material sub-layer 420, it should be ensured that they do not intersect. That is, the second sub-gate driving line 52 and the second sub-power line 82 need to extend in the same direction and are arranged in another direction. As shown in the figures, the second sub-gate driving line 52 also extends laterally, and is arranged from the second sub-power line 82 in the vertical direction. In some other embodiments, when the second sub-power line 82 extend in other direction, the second sub-gate driving line 52 also need to maintain the same extending direction as the second sub-power line 82.

In some other embodiments, when the second sub-power line 82 is not arranged in the second source and drain material sub-layer 420, the extending direction of the second sub-gate driving line 52 is not limited by the second sub-power line 82. For example, the first sub-gate driving line 51 extends in a first direction, and the second sub-gate driving line 52 extends in a second direction. Alternatively, the first sub-gate driving line 51 extends in the first direction, and the second sub-gate driving lines 52 cross transversely and longitudinally to form a grid shape. Still alternatively, in some other embodiments, when the second sub-gate driving line 52 is located in the first source and drain material sub-layer 410, the second sub-gate driving line 52 and the first sub-power line 81 do not intersect.

Further, as shown in FIG. 5, FIG. 6, FIG. 11 and FIG. 12, the first sub-gate driving line 51 and the second sub-gate driving line 52 both extend laterally, and the projections of the first sub-gate driving line 51 and the second sub-gate driving line 52 on the base substrate 100 substantially overlap, thereby preventing the second sub-gate driving line 52 from overlapping with other signal lines to increase parasitic capacitance. In addition, the projections of the first sub-gate driving line 51 and the second sub-gate driving line 52 on the base substrate 100 do not completely overlap. The region indicated by M shows a position where the projection of the first sub-gate driving line 51 is not covered by the projection of the second sub-gate driving line 52, and the position is exposed, which can reduce the influence on the gate potential of the driving transistor.

In one embodiment, the array substrate further includes an enable signal line, and the enable signal line may be used to provide the enable signal EM in FIG. 1. Referring to FIG. 5, FIG. 6, FIG. 11 and FIG. 12, the enable signal line includes a first sub-enable signal line 61 and a second sub-enable signal line 62. The first sub-enable signal line 61 is arranged in the first gate material layer 310 and extends from the peripheral area to the display area. One end of the first sub-enable signal line 61 located in the peripheral area is connected to a driving chip or a GOA driving circuit to receive the driving signal. The second sub-enable signal line 62 is arranged in the first source and drain material sub-layer 410 or the second source and drain material sub-layer 420, and is located at least in the display area. Since the first sub-enable signal line 61 and the second sub-enable signal line 62 are located in different layers, they are electrically connected through a via hole. Connecting two layers of enable signal lines in parallel can reduce the load resistance on the enable signal lines, thereby reducing the output power consumption of the driving circuit. The first sub-enable signal line 61 and the second sub-enable signal line 62 may extend in the same direction, or may extend in different directions.

When both the second sub-enable signal line 62 and the second sub-power line 82 are located in the second source and drain material sub-layer 420, it should be ensured that the two do not intersect. That is, the second sub-enable signal line 62 and the second sub-power line 82 need to extend in the same direction, and are arranged along another direction. As shown in the figures, the second sub-enable signal line 62 also extends in the lateral direction, and is arranged apart from the second sub-power line 82 in the vertical direction. In some other embodiments, when the second sub-power line 82 extends in other directions, the second sub-enable signal line 62 also needs to maintain the same extending direction as the second sub-power line 82.

In some other embodiments, when the second sub-power line 82 is not arranged in the second source and drain material sub-layer 420, the extending direction of the second sub-enable signal line 62 is not limited by the second sub-power line 82. For example, the first sub-enable signal line 61 extends in the first direction, and the second sub-enable signal line 62 extends in the second direction. Alternatively, the first sub-enable signal line 61 extends along the first direction, and the second sub-enable signal lines 62 cross horizontally and vertically to form a grid shape. Still alternatively, in some other embodiments, when the second sub-enable signal line 62 is located in the first source and drain material sub-layer 410, it should be ensured that the second sub-enable signal line 62 and the first sub-power line 81 do not intersect.

Further, in some embodiments, the first sub-enable signal line 61 and the second sub-enable signal line 62 both extend in the lateral direction, and their projections on the base substrate 100 overlap, thereby preventing the second sub-enable signal line 62 from overlapping with other signal lines to increase parasitic capacitance. In the embodiments shown in the figures, the projections of the first sub-enable signal line 61 and the second sub-enable signal line 62 on the base substrate 100 do not completely overlap, in order to avoid a situation where the second sub-enable signal line 62 is two close to other conductive structures in the layer. It can be understood that, on the basis of ensuring sufficient layout space, making the projections of the first sub-enable signal line 61 and the second sub-enable signal line 62 overlap is an optimal design.

Further, the array substrate of this embodiment includes both enable signal lines and gate driving signal lines. Therefore, the first sub-enable signal line 61 and the first sub-gate driving line 51 located in the same layer should not intersect, that is, they extend in the same direction. For example, as shown in the figures, the first sub-enable signal line 61 and the first sub-gate driving line 51 are both located in the first gate material layer 310, both extend laterally and are arranged apart along the vertical direction. Correspondingly, when the second sub-enable signal line 62 and the second sub-gate driving line 52 are located in the same layer, they should not intersect, that is, the second sub-enable signal line 62 and the second sub-gate driving line 52 extend in the same direction. For example, as shown in the figures, the second sub-enable signal line 62 and the second sub-gate driving line 52 are both located in the second source and drain material sub-layer 420, both extend laterally and are arranged apart along the vertical direction.

In one embodiment, the array substrate further includes a reset signal line, and the reset signal line may be used to provide the reset signal Reset in FIG. 1. Referring to FIG. 5, FIG. 6, FIG. 11 and FIG. 12, the reset signal line includes a first sub-reset signal line 71 and a second sub-reset signal line 72. The first sub-reset signal line 71 is arranged in the first gate material layer 310 and extends from the peripheral area to the display area. One end of the first sub-reset signal line 71 located in the peripheral area is connected to the driving chip or the GOA driving circuit to receive the driving signal. The second sub-reset signal line 72 is arranged in the first source and drain material sub-layer 410 or the second source and drain material sub-layer 420 and is located at least in the display area. Since the first sub-reset signal line 71 and the second sub-reset signal line 72 are located in different layers, they are electrically connected through a via hole. Connecting two layers of reset signal lines in parallel can reduce the load resistance on the reset signal lines, thereby reducing the output power consumption of the driving circuit. The first sub-reset signal line 71 and the second sub-reset signal line 72 may extend in the same direction, or may extend in different directions.

When both the second sub-reset signal line 72 and the second sub-power line 82 are located in the second source and drain material sub-layer 420, it should be ensured that they do not intersect, that is, they need to extend in the same direction and are arranged in another direction. As shown in the figures, the second sub-reset signal line 72 also extends in the lateral direction, and is arranged apart from the second sub-power line 82 in the vertical direction. In some other embodiments, when the second sub-power line 82 extends in another direction, the second sub-reset signal line 72 also needs to maintain the same extending direction as the second sub-power line 82.

In some other embodiments, when the second sub-power line 82 is not arranged in the second source and drain material sub-layer 420, the extending direction of the second sub-reset signal line 72 is not limited by the second sub-power line 82. For example, the first sub-reset signal line 71 extends along the first direction, and the second sub-reset signal line 72 extends along the second direction. Alternatively, the first sub-reset signal line 71 extends in the first direction, and the second sub-reset signal lines 72 cross transversely and longitudinally to form a grid shape. Still alternatively, in some other embodiments, when the second sub-reset signal line 72 is located in the first source and drain material sub-layer 410, it should be ensured that the second sub-reset signal line 72 and the first sub-power line 81 do not intersect.

Further, the first sub-reset signal line 71 and the second sub-reset signal line 72 both extend in the lateral direction, and their projections on the base substrate 100 overlap, thereby preventing the second sub-reset signal line 72 from overlapping with other signal lines to increase parasitic capacitance.

Further, the array substrate of this embodiment includes the enable signal lines, the gate driving signal lines and the reset signal lines at the same time. Therefore, the first sub-enable signal line 61, the first sub-gate driving line 51, and the first sub-reset signal line 71 in the same layer should not intersect, i.e., they extend in the same direction. As shown in the figures, the first sub-enable signal line 61, the first sub-gate driving line 51, and the first sub-reset signal line 71 are all located in the first gate material layer 310, and all extend laterally and are arranged apart along the vertical direction. Correspondingly, when the second sub-enable signal line 62, the second sub-gate driving line 52, and the second sub-reset signal line 72 are located in the same layer, they should not intersect, that is, they extend in the same direction. As shown in the figures, the second sub-enable signal line 62, the second sub-gate driving line 52, and the second sub-reset signal line 72 are all located in the second source and drain material sub-layer 420, and all extend laterally and are arranged apart from each other along the vertical direction.

Figure 15:
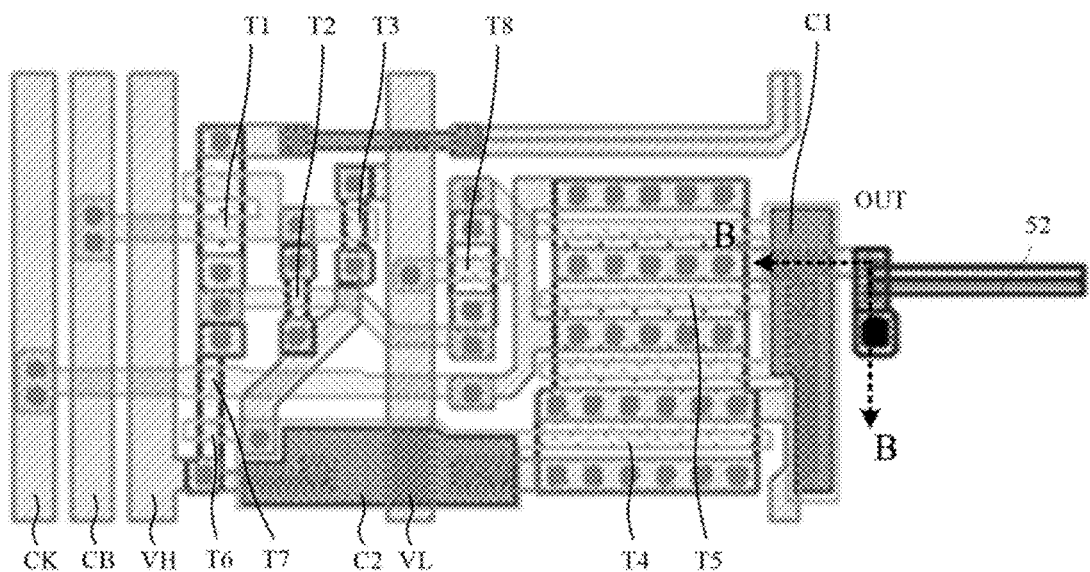
FIG. 15 is a structural layout of the GOA drive circuit shown in FIG. 14.

Referring to FIG. 15, the array substrate may further include a planarization layer 402. The planarization layer 402 is arranged between the first source and drain material sub-layer 410 and the second source and drain material sub-layer 420, and is located on a side of the insulating layer 401 away from the first source and drain material sub-layer 410, so that the distance between the first source and drain material sub-layer 410 and the second source and drain material sub-layer 420 is increased, which helps to reduce signal crosstalk between the crisscrossed data lines and power lines. Since the planarization layer is usually made of organic material, its thickness is larger than that of inorganic layers such as the interlayer dielectric layer 301 and the insulating layer 401, which can further alleviate the influence of signal crosstalk.

In the present disclosure, since the driving signal lines are arranged in two layers, the wiring space becomes larger, and the load resistance can be further reduced by increasing the line widths of the signal lines. Specifically, the first sub-signal line is located in the first gate material layer 310, and the second sub-driving signal line is located in the first source and drain material sub-layer 410 or the second source and drain material sub-layer 420. The resistivity of the first source and drain material sub-layer 410 or the second source and drain material sub-layer 420 is lower than the resistivity of the first gate material layer 310, and thus the line width of the second sub-signal line can be increased. For example, the line width of the second sub-signal line is larger than the line width of the first sub-signal line, so as to further reduce the overall load resistance of the driving signal lines. In a specific embodiment, the line width of the first sub-signal line is set to be about 3 µm, and the line width of the second sub-signal line is set to be greater than or equal to 5 µm, thereby greatly reducing the load resistance of the GOA circuit.

It should be noted that, in an embodiment, the gate material layer includes a first gate material layer 310 and a second gate material layer 320. The first sub-enable signal line 61, the first sub-gate driving signal line 51 and the first sub-reset signal line 71 are all located in the first gate material layer 310. The first gate material layer 310 is further provided with an electrode plate 91 of the capacitor (refer to FIG. 6). The second gate material layer 320 is used to arrange other electrode plate 92 of the capacitor and other conductive connection portions (refer to FIG. 7). In some other embodiments, the first sub-enable signal line 61, the first sub-gate driving signal line 51 and the first sub-reset signal line 71 may all be arranged in the second gate material layer 320. Alternatively, the three signal lines may be distributed in the two gate material layers. Of course, only one gate material layer may be provided, and the three signal lines are all located in the gate material layer.

In some other embodiments, the second sub-signal line of the present disclosure may also be located in other film layers with lower load resistance. For example, in a Low Temperature Polycrystalline Oxide (LTPO) backplate, that is, two TFT devices (LTPS and Oxide) are integrated in the same pixel, Oxide is a bottom gate structure, and LTPS is a top gate structure. The backplate also includes a third gate material layer arranged between the second gate material layer 320 and the first source and drain material sub-layer 410, and other conductive layers such as a shielding layer arranged between the poly semiconductor active layer and the base substrate. When the second sub-signal line is located in these conductive film layers, such arrangement can also reduce the overall load resistance of the driving signal lines.

Furthermore, in some embodiments, a third sub-signal line may also be arranged in other conductive layers (e.g., the third gate material layer, the shielding layer, etc.), and the first sub-signal line, the second sub-signal line and the third sub-signal line which are respectively located in three conductive layers may be connected in parallel through transfer holes, which can also reduce the overall load resistance of the driving signal lines.

In the present disclosure, the enable signal, gate driving signal and reset signal required in the pixel driving circuit can be provided by the GOA driving circuit located in the peripheral area. The GOA driving circuit can realize row scanning and can reduce the fabrication cost of the array substrate.

Figure 14:
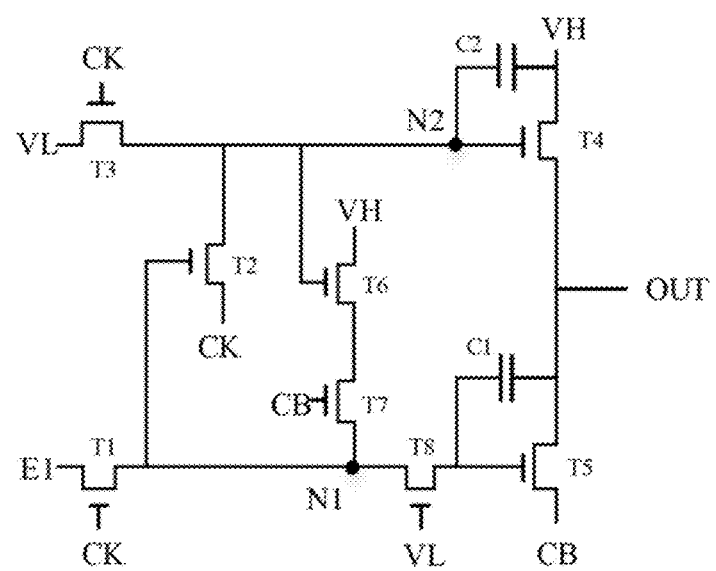
FIG. 14 is a circuit diagram of a GOA drive circuit.

FIG. 14 is a circuit diagram of a GOA driving circuit according to embodiment. The shift register circuit may include a first switching unit T1, a second switching unit T2, a third switching unit T3, a fourth switching unit T4, a fifth switching unit T4, a fifth switching unit T5, a sixth switching unit T6, a seventh switching unit T7, an eighth switching unit T8, a first capacitor C1, and a second capacitor C2. A control terminal of the first switching unit T1 is connected to a clock signal terminal CK, a first terminal of the first switching unit T1 is connected to an input signal terminal, and a second terminal of the first switching unit T1 is connected to a first node N1. A control terminal of the third switching unit T3 is connected to the clock signal terminal CK, a first terminal of the third switching unit T3 is connected to a power terminal VL, and a second terminal of the third switching unit T3 is connected to a second node N2. A control terminal of the second switching unit T2 is connected to the first node N1, a first terminal of the second switching unit T2 is connected to the terminal clock signal terminal CK, and a second terminal of the second switching unit T2 is connected to the second node N2. A control terminal of the sixth switching unit T6 is connected to the second node N2, a first terminal of the sixth switching unit T6 is connected to a power signal terminal VH. A control terminal of the seventh switching unit T7 is connected to a clock signal end CB, a first terminal of the seventh switching unit T7 is connected to a second terminal of the sixth switching unit T6, and a second terminal of the seventh switching unit T7 is connected to the first node N1. A control terminal of the eighth switching unit T8 is connected to the power supply terminal VL, and a first terminal of the eighth switching unit T8 is connected to the first node N1. A control terminal of the fifth switching unit T5 is connected to a second terminal of the eighth switching unit T8, a first terminal of the fifth switching unit T5 is connected to the clock signal terminal CB, and a second terminal of the fifth switching unit T5 is connected to an output end OUT. A control terminal of the fourth switching unit T4 is connected to the second node N2, a first terminal of the fourth switching unit T4 is connected to the power terminal VH, and a second terminal of the fourth switching unit T4 is connected to the output end OUT. The first capacitor C1 is connected between the second terminal of the eighth switching unit T8 and the output terminal OUT. The second capacitor C2 is connected between the power signal terminal VH and the second node N2.

FIG. 15 is a layout of the GOA driving circuit shown in FIG. 14. The power signal line VH, the clock signal line CK, and the clock signal line CB are all arranged in the second source and drain material sub-layer 420. One electrode plate of the first capacitor C1 is arranged in the first gate material layer 310, and the other electrode plate is arranged in the second gate material layer 320. One electrode plate of the second capacitor C2 is arranged in the first gate material layer 310, and the other electrode plate is arranged in the second gate material layer 320. In the layout of this embodiment, the output terminal OUT in the first gate material layer 310 is connected to the first sub-gate driving line 51 for outputting a gate driving signal to the first sub-gate driving line 51. The GOA driving circuit is located in the peripheral area, so the first sub-gate driving line 51 also extends from the peripheral area to the display area. As shown in the figure, the second sub-gate driving line 52 can also extend from the peripheral area to the display area, and the projection of a part of the second sub-gate driving line 52 in the peripheral area on the base substrate 100 overlaps with the projection of a part of the first sub-gate driving line 51 in the peripheral area on the base substrate 100, and the two parts are electrically connected through via holes provided in the peripheral area. FIG. 15 shows a cross-sectional view of FIG. 14 in the direction B-B. Since the first gate material layer 310 and the second source and drain material sub-layer 420 are separated by the first source and drain material sub-layer 410, it is needed to set a conductive connection portion 80 in the first source and drain material sub-layer 410 to connect the first sub-gate driving line 51 and the second sub-gate driving line, that is, the conductive connection portion 80 and the first sub-gate driving line 51 are connected through a via hole, and the conductive connection portion 80 and the second sub-gate driving line 52 are connected through another via hole.

In other embodiments, the via holes may also be arranged in other positions, such as in the display area. The number of via hole can be set to be one or more, which is not specifically limited in embodiments of the present disclosure. When the number of via holes is multiple, they can be provided on opposite sides of the peripheral area respectively, so as to electrically connect the first sub-gate driving line 51 and the second sub-gate driving line 52, but the via holes are not provided in the display area so as to avoid the manufacturing of via holes in the display area and improve the resolution.

Figure 16:
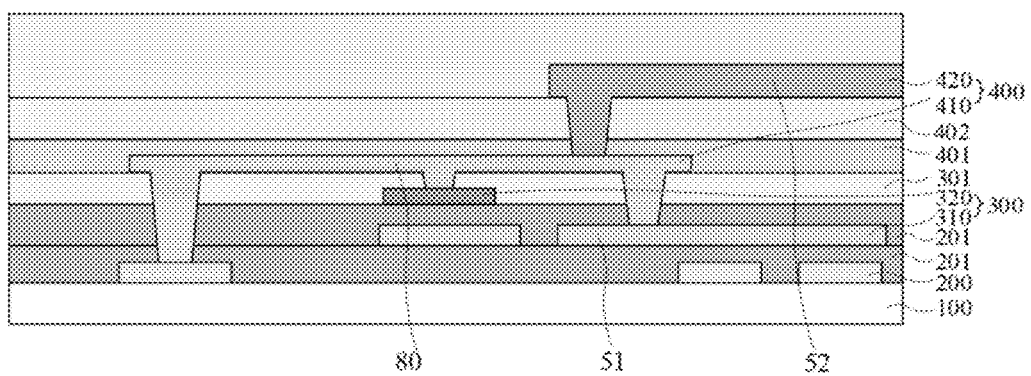
FIG. 16 is a schematic cross-sectional view taken along the direction B-B in FIG. 15.

FIG. 15 and FIG. 16 illustrate a layout structure between the GOA driving circuit and the pixel circuit by taking the gate driving line as an example. The GOA is a gate GOA. Those skilled in the art can understand that the reset signal line for sub-pixels of a latter stage can be connected to the gate driving line of the sub-pixels of a former stage, so that the gate driving signal of the sub-pixels of the former level can be used as the reset signal of the sub-pixels of the latter stage. This can avoid introducing a special signal line for the reset signal, and effectively reduce the wiring space. Therefore, the connection relationship may be that the output terminal of the Gate GOA driving circuit is also connected to the first sub-reset signal line 71, and then connected to the second sub-reset signal line 72 through a via hole to transmit the reset signal to each pixel unit. In addition, the GOA driving circuit may also include an output terminal capable of outputting an enable signal. The output terminal is connected to the first sub-enable signal line 61 of the pixel circuit, and further connected to the second sub-enable signal line 62 through a via hole, in order to transmit the enable signal to each pixel unit. That is, the GOA is the EM GOA. It should be noted that the Gate GOA and the EM GOA may be an integral GOA, or may be two independent GOAs, which are not specifically limited in embodiments of the present disclosure.

It should be understood that, the shift register unit provided in FIG. 13 can be used in a display panel in cooperation with the pixel driving circuit in FIG. 1, and the shift register unit provided in this example embodiment can also be used in combination with other pixel driving circuits in a display panel, or, the pixel driving circuit provided in example embodiments can also be used in a display panel with other shift register units. Embodiments of the present disclosure do not impose specific limitations on the shift register unit and the pixel driving circuit.

Embodiments of the present invention further provide a display device, which includes the array substrate of the above-mentioned embodiments. Since the display device includes the above-mentioned array substrate, it has the same beneficial effects, and details are not described herein again.

Embodiments of the present disclosure do not impose specific limitations on the display device, and the display device may be any product or part having a flexible display function, such as a TV, a notebook computer, a tablet computer, a wearable display device, a mobile phone, a vehicle-mounted display, a navigation device, an e-book, a digital photo frame, an advertising light box, and so on.

It has been verified that the double-layer structure arrangement of the driving signal lines according to embodiments of the present disclosure can reduce the load resistance of the GOA circuit to 0.65 kΩ. Compared with a single-layer structure, the GOA circuit load according to embodiments of the present disclosure is reduced to 49% of the single-layer structure, which greatly reduces the output power consumption of the GOA, and can also reduce the size of the output lines of the GOA circuit.

Other embodiments of the present disclosure will readily occur to those skilled in the art upon consideration of the specification and practice of the technical solutions disclosed herein. The present disclosure is intended to cover any variations, uses, or adaptations that follow the general principles of the present disclosure and include common general knowledge or techniques in the technical field not disclosed by the present disclosure. The description and examples are to be regarded as exemplary only, the true scope and spirit of the present disclosure are defined by the appended claims.

What is claimed is:

1. An array substrate having a display area and a peripheral area surrounding the display area, wherein the array substrate further comprises:

a base substrate;

a gate material layer arranged on a side of the base substrate; and a source and drain material layer arranged on a side of the gate material layer away from the base substrate;

wherein the array substrate further comprises a driving signal line, the driving signal line comprises a first sub-signal line and a second sub-signal line, the first sub-signal line is arranged in the gate material layer and extends from the peripheral area to the display area, the second sub-signal line is arranged in the source and drain material layer and located at least in the display area, and the first sub-signal line and the second sub-signal line are electrically connected through a via hole.

2. The array substrate according to claim 1, wherein the source and drain material layer comprises:

a first source and drain material sub-layer arranged on the side of the gate material layer away from the base substrate; and a second source and drain material sub-layer arranged on a side of the first source and drain material sub-layer away from the base substrate;

wherein the second sub-signal line is arranged in the first source and drain material sub-layer or the second source and drain material sub-layer.

3. The array substrate according to claim 2, wherein:

the driving signal line comprises a gate driving signal line;

the first sub-signal line comprises a first sub-gate driving line;

the second sub-signal line comprises a second sub-gate driving line;

the first sub-gate driving line is arranged in the gate material layer and extends from the peripheral area to the display area;

the second sub-gate driving line is arranged in the first source and drain material sub-layer or in the second source and drain material sub-layer and the second sub-gate driving line is located at least in the display area; and the first sub-gate driving line and the second sub-gate driving line are electrically connected through a via hole.

4. The array substrate according to claim 2, wherein:

the driving signal line comprises an enable signal line;

the first sub-signal line comprises a first sub-enable signal line;

the second sub-signal line comprises a second sub-enable signal line;

the first sub-enable signal line is arranged in the gate material layer and extends from the peripheral area to the display area;

the second sub-enable signal line is arranged in the first source and drain material sub-layer or in the second source and drain material sub-layer and the second sub-enable signal line is located at least in the display area; and the first sub-enable signal line and the second sub-enable signal line are electrically connected through a via hole.

5. The array substrate according to claim 2, wherein:

the driving signal line comprises a reset signal line;

the first sub-signal line comprises a first sub-reset signal line;

the second sub-signal line comprises a second sub-reset signal line;

the first sub-reset signal line is arranged in the gate material layer and extends from the peripheral area to the display area;

the second sub-reset signal line is arranged in the first source and drain material sub-layer or in the second source and drain material sub-layer and the second sub-reset signal line is located at least in the display area; and the first sub-reset signal line and the second sub-reset signal line are electrically connected through a via hole.

6. The array substrate according to claim 2, wherein the first sub-signal line and the second sub-signal line extend in a same direction, or extend in different directions.

7. The array substrate according to claim 6, wherein the array substrate further comprises a power line, the power line comprises a first sub-power line and a second sub-power line, the first sub-power line is arranged in the first source and drain material sub-layer, the second sub-power line is arranged in the second source and drain material sub-layer, and the first sub-power line and the second sub-power line are electrically connected through a via hole.

8. The array substrate according to claim 7, wherein the second sub-signal line and the second sub-power line are both located in the second source and drain material sub-layer, and the second sub-signal line and the second sub-power line extend in a same direction and are arranged in another direction.

9. The array substrate according to claim 8, wherein the first sub-signal line extends in a first direction, the first sub-power line extends in a second direction, the second sub-signal line and the second sub-power line both extend in the first direction and are arranged along the second direction, and the first direction and the second direction intersect.

10. The array substrate according to claim 7, wherein the second sub-signal line is further located in the peripheral area, and the first sub-signal line and the second sub-signal line are electrically connected through the via hoe in the peripheral area.

11. The array substrate according to claim 1, wherein a line width of the second sub-signal line is greater than a line width of the first sub-signal line.

12. The array substrate according to claim 2, further comprising:

an interlayer dielectric layer arranged between a second gate material layer and the first source and drain material sub-layer;

an insulating layer arranged between the first source and drain material sub-layer and the second source and drain material sub-layer; and a planarization layer arranged between the first source and drain material sub-layer and the second source and drain material sub-layer, and located on a side of the insulating layer away from the first source and drain material sub-layer.

13. The array substrate according to claim 1, wherein the array substrate comprises a GOA driving circuit, and the first sub-signal line is connected to an output terminal of the GOA driving circuit.

14. The array substrate according to claim 1, wherein the gate material layer comprises a first gate material layer and a second gate material layer that are stacked and a gate insulating layer between the first gate material layer and the second gate material layer, and the first sub-signal line is located in the first gate material layer or the second gate material layer.

15. A display device, comprising an array substrate having a display area and a peripheral area surrounding the display area, wherein the array substrate further comprises:
- a base substrate;
- a gate material layer arranged on a side of the base substrate; and
- a source and drain material layer arranged on a side of the gate material layer away from the base substrate;
- wherein the array substrate further comprises a driving signal line, the driving signal line comprises a first sub-signal line and a second sub-signal line, the first sub-signal line is arranged in the gate material layer and extends from the peripheral area to the display area, the second sub-signal line is arranged in the source and drain material layer and located at least in the display area, and the first sub-signal line and the second sub-signal line are electrically connected through a via hole.

16. The display device according to claim 15, wherein the source and drain material layer comprises:
- a first source and drain material sub-layer arranged on the side of the gate material layer away from the base substrate; and
- a second source and drain material sub-layer arranged on a side of the first source and drain material sub-layer away from the base substrate;
- wherein the second sub-signal line is arranged in the first source and drain material sub-layer or the second source and drain material sub-layer.

17. The display device according to claim 16, wherein:
the driving signal line comprises a gate driving signal line;
the first sub-signal line comprises a first sub-gate driving line;
the second sub-signal line comprises a second sub-gate driving line;
the first sub-gate driving line is arranged in the gate material layer and extends from the peripheral area to the display area;
the second sub-gate driving line is arranged in the first source and drain material sub-layer or in the second source and drain material sub-layer and the second sub-gate driving line is located at least in the display area; and
the first sub-gate driving line and the second sub-gate driving line are electrically connected through a via hole.

18. The display device according to claim 16, wherein:
the driving signal line comprises an enable signal line;
the first sub-signal line comprises a first sub-enable signal line;
the second sub-signal line comprises a second sub-enable signal line;
the first sub-enable signal line is arranged in the gate material layer and extends from the peripheral area to the display area;
the second sub-enable signal line is arranged in the first source and drain material sub-layer or in the second source and drain material sub-layer and the second sub-enable signal line is located at least in the display area; and
the first sub-enable signal line and the second sub-enable signal line are electrically connected through a via hole.

19. The display device according to claim 16, wherein:
the driving signal line comprises a reset signal line;
the first sub-signal line comprises a first sub-reset signal line;
the second sub-signal line comprises a second sub-reset signal line;
the first sub-reset signal line is arranged in the gate material layer and extends from the peripheral area to the display area;
the second sub-reset signal line is arranged in the first source and drain material sub-layer or in the second source and drain material sub-layer and the second sub-reset signal line is located at least in the display area; and
the first sub-reset signal line and the second sub-reset signal line are electrically connected through a via hole.

20. The display device according to claim 16, wherein the first sub-signal line and the second sub-signal line extend in a same direction, or extend in different directions.

* * * * *